United States Patent [19]
Anzai et al.

[11] 3,754,171
[45] Aug. 21, 1973

[54] INSULATED GATE TYPE FIELD EFFECT SEMICONDUCTOR DEVICE HAVING A BREAKDOWN PREVENTING ELEMENT

[75] Inventors: Norio Anzai, Kodaira-shi; Takeshi Takagui, Musashino-shi; Yasunobu Kosa, Kodaira-shi; Masaharu Kubo, Kokubunji-shi; Hiroto Kawagoe, Kodaira-shi, all of Japan

[73] Assignee: Hitachi, Ltd., Tokyo, Japan

[22] Filed: Feb. 23, 1968

[21] Appl. No.: 707,857

[30] Foreign Application Priority Data

Feb. 27, 1967 Japan ............................... 42/12086

[52] U.S. Cl. ............. 317/235 R, 307/202, 307/304, 317/235 G, 317/235 T

[51] Int. Cl. ........................................... H01l 19/00

[58] Field of Search ............ 317/235, 235 B, 235 G, 317/235 T; 330/88 FE; 307/202, 205, 237, 251, 279, 303, 304

[56] References Cited

UNITED STATES PATENTS 3,390,314 6/1968 Medwin ............................ 317/235

OTHER PUBLICATIONS

IEEE Trans. on Electron Devices, "Breakdown Voltages of Germanium Plane-Cylindrical Junctions" by Gibbons et al. page 193–194 April 1965.

*Primary Examiner*—Jerry D. Craig
*Attorney*—Craig, Antonelli & Hill

[57] ABSTRACT

An MOS field effect transistor comprising an N-type semiconductor substrate having a P type diffused region formed therein which is more shallow than a P type source and a P type drain diffused regions, the shallow diffused region being connected to a gate electrode by a conductive means, and utilizing the breakdown phenomenon of a PN junction formed between the shallow diffused region and the substrate thereby to prevent the breakdown of an insulating layer under the gate electrode.

7 Claims, 6 Drawing Figures

Patented Aug. 21, 1973 3,754,171

INVENTORS
NORIO ANZAI, TAKESHI TAKAGUI,
YASUNOBU KOSA, MASAHARU KUBO
HIROTO KAWAGOE

BY Craig & Antonelli
ATTORNEYS

INSULATED GATE TYPE FIELD EFFECT SEMICONDUCTOR DEVICE HAVING A BREAKDOWN PREVENTING ELEMENT

This invention relates to a semiconductor device, and more particularly to an insulated gate type field effect semiconductor device having a breakdown preventing circuit device as well as to a method of manufacturing the same.

Generally, in a semiconductor device having an insulated gate electrode such as an MIS (Metal Insulator Semiconductor) type field effect transistor in order to prevent a breakdown of the insulated gate electrode or the dielectric breakdown of an insulating layer disposed under the gate electrode due to an external surge voltage, the reverse breakdown phenomenon of a diode is utilized and thereby, a surge voltage such as a large false signal or a noise signal at a constant level is clamped. However, some improvements have been desired in such a prior art device because the protection effect can not be obtained except in a low voltage region or for a surge voltage having a special wave form. Further, when a surge voltage having an extremely steep rising charcteristic is applied, the insulating layer often breaks down before the operation of the protecting diode.

An object of this invention is to provide an improved breakdown preventing circuit device for a field effect semiconductor device having an insulated gate electrode, and a new method of manufacturing the same.

Another object of this invention is to provide an insulated gate type field effect transistor having a circuit device for preventing the gate breakdown phenomenon, and a method of manufacturing the same.

Briefly, the gist of this invention may be summarized as an insulated gate type field effect semiconductor device having a protecting circuit device and a method of manufacturing the same, the semiconductor device comprising a semiconductor substrate of a first conductivity type, a first semiconductor region of a second conductivity type formed in one principal surface of substrate, an insulating film covering at least one portion of the surface of substrate, a gate electrode formed on film, a second semiconductor region of a second conductivity type formed in principal surface to a depth less than first region with an interval or a spacing therefrom, and a conducting means connecting second region and gate electrode. The breakdown phenomenon of a PN junction formed between substrate and second region is used to prevent the breakdown of film. Namely, the PN junction is utilized as a protecting diode or a clamping diode.

In a further improved circuit device of this invention, an input terminal is further provided on said second region with an interval from conducting means, from which a control signal is applied to the gate electrode through second region and conducting means.

According to the inventive device, since the reverse breakdown voltage between second region and the substrate is rather small, the thickness of the insulating film under the gate electrode may be small. Therefore, even a small signal applied at the gate electrode can yield a desired field effect characteristic sufficiently. The protection of the film from breakdown due to various kinds of surge voltage is very effective.

Further, according to the above-described improved device since the input terminal is fitted to the second region, when a signal is applied through this terminal to the gate electrode, a resistive component appears between the protecting diode and the gate electrode. Therefore, the time constant of the input circuit of the protected semiconductor device which is in parallel with the protecting diode becomes larger than that of the diode. So, the protecting action of the diode against a surge voltage having a steep rise characteristic is achieved. In this case, the capacitance of a PN junction formed between the second region and the substrate distributes in the longitudinal direction of the resistive component so that an R-C low pass filter is connected equivalently to the above input circuit. This yields a function of suppressing a surge voltage having a rather large peak value, which is considered to contribute to the prevention of breakdown of the above-described film.

This invention will now be described by way of example with reference to the accompanying drawings in which.

FIGS. **5*a* and 5*b*** illustrate a cross sectional view of an insulated gate type field effect transistor according to another embodiment of this invention and an equivalent circuit diagram thereof, respectively.

Figure 1:
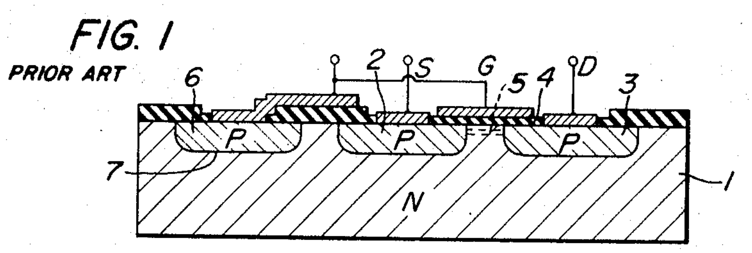
FIG. 1 is a cross sectional view of a prior art MOS field effect transistor having a protecting diode.

In order to understand this invention easily a brief explanation will be made first of a well known MOS field effect transistor as shown in FIG. 1, in which the transistor comprises: an N-type silicon substrate 1; two regions 2 and 3 of P-type formed in the surface of silicon substrate 1; a source electrode S and a drain electrode D provided on each region; an insulating film 4 formed between the two regions 2 and 3 on the semiconductor substrate; and a gate electrode G provided on this film 4. In such a transistor, in order to increase the mutual conductance Gm and obtain a good electrical characteristic the insulating film 4 under the gate electrode G is preferably as thin as possible. However, if the thickness of this film is equal to or less than 1,500 A., the breakdown voltage thereof decreases to, for example, about 100 volts. A large noise or a false signal applied at the gate electrode or the electrification phenomenon from an external electric field due to a high capacitive impedance existing between the gate and the source causes a permanent breakdown of the insulating film 4. It is proposed to form a P-type diffused region 6 in one portion of the substrate surface and to connect this region 6 to the gate electrode by a conductive means. Use is made of the breakdown phneomenon of a PN junction 7 thus formed to prevent the breakdown of insulating layer 4. The PN junction diode formed between the region 6 and the substrate 1 is called a protecting diode (or a clamp diode).

The P type diffused region 6 is formed simultaneously with the source region 2 and the drain region 3 by selectively diffusing a P-type impurity into the substrate. As the field effect transistor operates with P-channel enhancement mode and the gate electrode is at a negative electric potential with respect to the source during operation, the desired polarity of the protecting diode becomes the same as that of a PN junction diode obtained simultaneously with the source and drain regions. Thus, the simultaneous diffusion process is convenient in terms of the method of manufacture and utilization.

If the protection of the insulating layer 4 under the gate electrode is to be secured by th protecting diode, it is necessary for the reverse breakdown voltage of the PN junction to be much smaller than the breakdown voltage of the insulating layer. Hence, the resistivity of the substrate is required to be low. Since in an MOS transistor the PN junction between the substrate 1 and the drain region 3 is usually biased in a reverse direction, the breakdown voltage thereof and hence the resistivity of the substrate should be high. It has been difficult in the prior art to meet these opposite requirements and to obtain an effective field effect semiconductor device.

According to this invention, a field effect semiconductor device having at least one PN junction and an insulated gate electrode is formed at the surface region of a semiconductor substrate and a shallower PN junction is formed in the surface region. It is particularly desirable that the shallow PN junction is 1 to 2 $\mu$ in thickness. Thus, the breakdown of the gate electrode of the device can be prevented.

Figure 2:
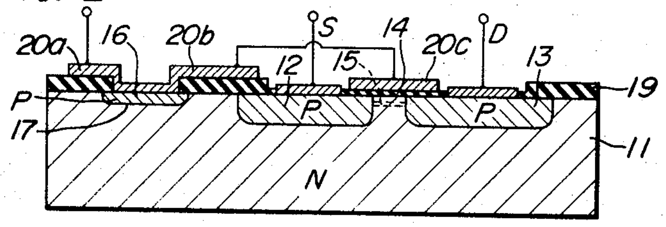
FIG. 2 is a cross sectional view of an MOS field effect transistor having a protecting diode according to one embodiment of this invention.
Figure 3:
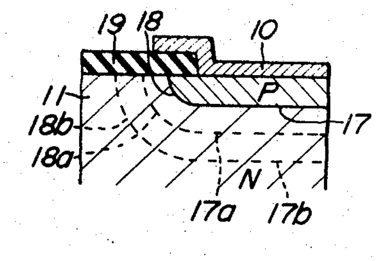
FIG. 3 is a partially enlarged cross sectional view of the protecting diode shown in FIG. 2.

An explanation will be made hereinafter of an embodiment of this invention with reference to FIG. 2. An N type silicon substrate 11 having a resistivity of 1 to 10 $\Omega$·cm has in its principal surface a pair of P type diffused regions, i.e. a source region 12 and a drain region 13 having a relatively large thickness of 4 to 8 $\mu$. In another portion of the principal surface a relatively shallow P type region 16 of 1 to 2 $\mu$ (a diode region) is formed. A relatively thin gate insulating film 14 (e.g. silicon oxide) having a thickness of 1,000 to 1,500 A. is provided between the source and drain regions on the surface of substrate. This film serves to insulate the gate electrode 20*c* from the substrate 11, the gate electrode being provided to induce a channel 15 in the surface of substrate. A source electrode S and a drain electrode D are ohmically connected to the source region 12 and the drain region 13 respectively. An interconnection layer 20*b* extending from the input terminal 20*a* and connected ohmically to the surface of the diode region 16 lies on an insulating film 19 to be connected to the gate electrode 20*c*, the insulating film 19 being made of a silicon oxide film of 5,000 to 10,000 A. to passivate a portion of the principal surface having no ohmic contact thereon. For the sake of convenience in FIG. 2 the interconnection layer 20*b* formed in one unitary body with the input terminal 20*a* is shown not united with the gate electrode 20*c* in practice a connection is made between the layer 20*b* and the electrode 20*c* by means of an evaporated conducting layer of, for example, aluminium. The PN junction 17 formed between the diode region 16 and the substrate 11 is so constructed that it has a sufficiently lower breakdown voltage compared to the breakdown voltage of the gate insulating layer 14. For example, the breakdown voltage of the gate insulating layer 14 is selected to be one hundred and several tens volts while that of PN junction 17 is 50 to 60 volts. The PN junction 17 having such a low breakdown voltage can be obtained by a shallow diffused layer as shown enlarged in FIG. 3. The maximum curvature portion 18 of the shallow junction 17 has a greater curvature than the portions 18*a* and 18*b* of deep junctions 17*a* and 17*b*. As the electric field concentrates at the maximum curvature portion 18, breakdown occurs at a low voltage. When a selective mask of a silicon inorganic compound film is formed on the surface of the semiconductor substrate to introduce into prescribed portions thereof an impurity determining the conductivity type, it is considered that the diffusion of impurity is uniformly made in all direction almost regardless of the crystal axis. Therefore, the radius of curvature at the maximum curvature portion may be considered to be substantially equal to the depth of junction.

Such a rectifying junction having a low breakdown voltage may be obtained by other methods such as the epitaxial growth method and the alloying method.

Figure 4:
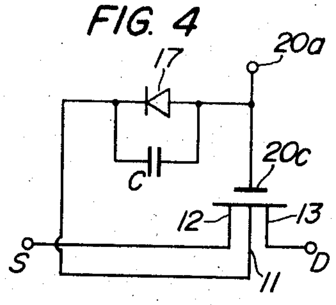
FIG. 4 is an equivalent circuit diagram of a transistor shown in FIG. 2.

The equivalent circuit diagram of an example of a field effect transistor having a protecting diode is shown in FIG. 4. The protection of the field effect semiconductor device from a breakdown will be explained next with reference to FIGS. 2 and 4, in which like reference numerals are used to denote like parts. We will consider a case when a signal is applied between the substrate 11 and the input terminal 20*a* to give a reverse bias to the PN junction 17 and control the conductance of the channel 15 under the gate electrode 20*c* of the field effect transistor. The signal in a normal state has an amplitude lower than the breakdown voltage of the gate insulator 14 and is suitable for the operation of this transistor. However, if a noise having a large amplitude is applied to the input terminal 20*a* together with the above normal signal, the PN junction 17 breaks down and the gate potential is clamped at the breakdown voltage level of the PN junction, thus preventing the breakdown of the gate insulator 14. In the absence of a normal signal or a noise the gate potential also increases extremely due to the electrification phenomenon during non-operation of the transistor, causing thus a danger of breakdown to the insulator 14. Also in such a case the clamping operation of the PN junction according to this invention prevents the insulator 14 from a breakdown.

The above-described field effect transistor having such a protecting diode can be obtained by the following method.

In the first place an N type silicon substrate 11 having a resistivity of 1 to 10 $\omega$·cm and a thickness of about 200 $\mu$ is prepared on the surface of which a silicon oxide film 19 of 5,000 to 10,000 A. is formed by thermal growth. By applying the photo-etching treatment to the oxide film a first and a second holes for a source region 12 and a drain region 13 are provided respectively. An acceptor impurity such as boron is diffused through these holes in the surface region of substrate thereby to form a source region 12 and a drain region 13 having a depth of 4 to 8 $\mu$ as shown in FIG. 2. By this diffusion treatment the holes are covered with a new oxide film. A third hole for a diode region 16 is provided in another portion of the oxide film 19. An impurity such as boron is shallowly diffused through the third hole to form a diode region 16 having a depth less than 2 $\mu$, preferably about 1 $\mu$. It is desirable that the diode region 16 has a small area in order to decrease the parallel capacitance C shown in FIG. 4. After the shallow diffusion the third hole is covered with a new oxide film. Next, one portion of the thicker oxide film lying between the source and drain regions is removed to expose the surface of substrate. This exposed portion is subjected to a high temperature water vapor to be oxidized, growing a new gate oxide film 14 of silicon oxide having a thickness of 1,000 to 1,500 A. A portion of the oxide film on the diode region 16, the source region 12, and the drain region 13 is removed to provide a hole for an electrode layer to each region. Aluminium is evaporated on the surface of the substrate and the oxide films 14 and 19. Thereafter, the aluminium layer is removed such that the input terminal layer 20*a*, the interconnection layer 20*b* which is in contact with the diode region 16 and are connected while the gate layer 20*c*, the source electrode S and drain electrode D are left by themselves obtaining such a structure as shown in FIG. 2.

According to this manufacturing method, the defect of a prior art method as seen in the uniform and shallow formation of regions 12 and 13, i.e. the difficulty in controlling the distance or the channel width between these regions can be overcome. In more detail, usually the channel width is controlled by the interval between a pair of holes provided in the oxide film for the formation of source and drain regions and the diffusion depth of these regions. The channel width is controlled to be a few $\mu$ in many cases. According to the prior art method, in order to obtain such a narrow width the interval between the holes should be extremely small due to a shallow diffusion treatment made simultaneously with the diode region. The minute treatment by photoetching of such holes should be performed with a higher precision, which is disadvantageous from a practical viewpoint. Products obtained by such a prior method are not uniform. According to this invention, as the diffusion of the two regions 12 and 13 is made separately from the diode region 16 and more deeply than the diode region 16, the interval between the two holes for the formation of said two regions may be large and products of uniform characteristic can be obtained by a simple manufacturing process. For example, a field effect transistor having a channel width of about 2 $\mu$ is obtained by selecting the interval between the holes to be 10 $\mu$ and the diffusion depth of the source and drain regions 4 $\mu$. The breakdown voltage of the drain PN junction has a desired high value by selecting a high substrate resistivity, while the resistivity of the diode PN junction 17 having a shallow depth of 1 to 2 $\mu$ is a desired low value.

A silicon nitride film can be used instead of the silicon oxide film 19.

Figure 5B:
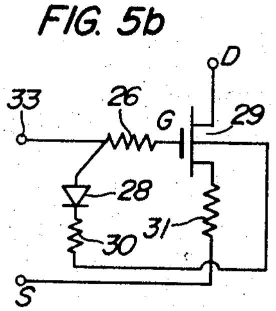
Figure 5A:
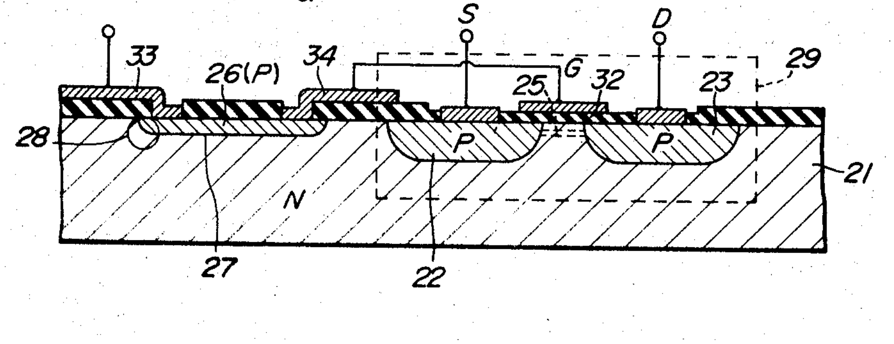

FIGS. 5*a* and 5*b* show a field effect transistor having a protecting element according to another embodiment of this invention, and an equivalent circuit thereof respectively. In this embodiment as shown in FIG. 5*a* all except a protecting element region 26 are similar to those in FIG. 2. Explanations with reference to FIGS. 5*a* and 5*b* are as follows. A shallow P type diffused region 26 of 1 to 2 $\mu$ depth has an input terminal 33 and an interconnection layer 34 connected to a gate electrode 32. A resistance of the order of several k$\omega$ exists in the shallow diffused region 26 between the terminals 33 and 34. The capacitance of a junction 27 is about 3 to 6 pF. The function of preventing the breakdown of the gate is improved by this structure by three to four times in comparison with a prior art shown in FIG. 1. For example, it is observed in the field effect transistor of FIG. 1 that application of a step wave voltage of about 150 volts yields substantially 100 percent breakdown probability while in this embodiment application of such a voltage hardly causes an accident and even application of 400 volts yields only 40 percent breakdown probability.

There are several reasons for such a good result. As shown in an equivalent circuit of FIG. 5*b*, it is considered that the end portion 28 of the PN junction 27 in FIG. 5*a* acts as a clamp diode and that a resistance 26 is inserted between one terminal 33 of the clamp diode and the gate electrode G. Namely, under the condition that the substrate 21 and the source electrode S are maintained at a nearly equal electric potential, when a surge voltage having a large amplitude exceeding the breakdown voltage of the gate insulator 32 is applied between the input terminal 33 and the source electrode S and gives a reverse bias to the PN junction 27 of the diode, it is considered that the breakdown of the diode occurs much earlier than that of gate insulator as the time constant of the input circuit of the transistor connected in parallel with the diode is made much larger by the insertion of the resistor 26 than that of the diode determined by the capacitance of the diode 27 and the equivalent resistance 30 of substrate 21. The resistance 31 in FIG. 5*b* shows the equivalent resistance in the source region 22 in FIG. 5*a*, and the resistance value is about few $\omega$. The formation of a low pass R-C filter by the resistive component of the diode region 26 and the PN junction 27 decreases the amplitude of a surge voltage having a special kind of wave form, thereby preventing further more completely the breakdown of electrode.

Although the foregoing explanations have been made of particular embodiments of this invention, it may be possible for those skilled in art to make minute modifications easily without departing from the scope of the appended claim.

For example, although a combination of a simply manufactured PN diode and a P-channel enhancement mode MOSFET has been particularly described, it is an easy matter of choice as occasion demands to use an N-channel depletion mode FET and other field effect semiconductor devices in combination with a PN diode, an NP diode, a PNP diode or an NPN diode or with one of such diodes suitably biased in accordance with a predetermined polarity of input signal.

What is claimed is:

1. An insulated gate type field effect semiconductor device having a breakdown preventing circuit element comprising: a semiconductor substrate of a first conductivity type having a principal surface; a first semiconductor region of a second conductivity type formed in the principal surface of said substrate; a second semiconductor region of a second conductivity type formed in said principal surface in a spaced relation to said first region, the depth of said second region being shallower than that of said first region; an insulating film extending on said principal surface of said substrate and covering at least one portion of a termination of a first PN junction formed between said first region and said substrate; a gate electrode on said insulating film, the reverse breakdown voltage of a second PN junction formed between said second region and said substrate being lower than the breakdown voltage of said insulating film under said gate electrode; a first and a second spaced conducting layer connected to the surface of said second region; and a conductive means connecting electrically said gate electrode layer and said first conducting layer, thereby an input signal is applied to said gate electrode through said second conducting layer.

2. A circuit device according to claim 1, wherein the resistance existing in said second region between said first and second conducting layers have a sufficiently large value to determine a time constant of circuit such that when a voltage exceeding the breakdown voltage of said insulating film under said gate electrode is applied between said second conducting layer and said first region and gives a reverse bias to said second PN junction between said substrate and said second region the voltage applied to said second PN junction reaches its reverse breakdown voltage before that applied to said insulating film reaches the breakdown voltage thereof.

3. An insulated gate type field effect semiconductor device according to claim 1, wherein said first and second conductivity types are N and P types respectively and the depth of said second region do not exceed 2 $\mu$.

4. An insulated gate type field effect semiconductor device according to claim 1, wherein one portion of the PN junction formed between said substrate and said second region is used as a protecting diode.

5. An insulated gate type field effect transistor comprising a semiconductor substrate of a first conductivity type having a major surface; a source and a drain region of a second conductivity type opposite to the first conductivity type formed in the major surface of said substrate; an insulating film covering at least the major surface of said substrate between said source and drain regions; a gate electrode formed on said insulating film; an elongated semiconductor region of the second conductivity type formed in the major surface of said substrate; a PN junction defined between said semiconductor region and said substrate, said PN junction having a breakdown voltage lower than that of said insulating film under said gate electrode; first and second electrode contacts connected to the surface of said semiconductor region; conducting means for connecting said gate electrode to one of said electrode contacts; means for applying an input signal between said substrate and the other electrode contact, thereby the input signal is applied to said gate electrode through said semiconductor region and said conducting means.

6. An insulated gate type field effect transistor according to claim 5, wherein said substrate is composed of N type silicon, said source and drain regions and said elongated semiconductor region are composed of P type silicon, said insulating film under said gate electrode consists essentially of silicon oxide and has a thickness of not more than 1,500 A., and the depth of said elongated semiconductor region is not more than 2$\mu$.

7. An insulated gate type field effect transistor according to claim 5, wherein said elongated semiconductor region is shallower than said source and drain regions.

* * * * *